(12) United States Patent
Muto et al.

(10) Patent No.: US 8,981,315 B2
(45) Date of Patent: Mar. 17, 2015

(54) ION BEAM DEVICE HAVING GAS INTRODUCTION PORT DISPOSED ON STRUCTURE MAINTAINED AT GROUND POTENTIAL

(75) Inventors: Hiroyuki Muto, Tokyo (JP); Yoshimi Kawanami, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/238,397

(22) PCT Filed: May 28, 2012

(86) PCT No.: PCT/JP2012/003450
§ 371 (c)(1),
(2), (4) Date: Feb. 11, 2014

(87) PCT Pub. No.: WO2013/035221
PCT Pub. Date: Mar. 14, 2013

(65) Prior Publication Data
US 2014/0197329 A1 Jul. 17, 2014

(30) Foreign Application Priority Data
Sep. 5, 2011 (JP) ................................. 2011-192271

(51) Int. Cl.
*H01J 37/28* (2006.01)
*H01J 37/317* (2006.01)
*H01J 37/08* (2006.01)

(52) U.S. Cl.
CPC ................. *H01J 37/08* (2013.01); *H01J 37/28* (2013.01); *H01J 2237/0807* (2013.01); *H01J 2237/18* (2013.01); *H01J 2237/31749* (2013.01)

USPC ................... 250/423 F; 250/423 R; 250/424; 250/426; 250/221; 250/453.11

(58) Field of Classification Search
USPC ............. 250/423 R, 423 F, 424, 426, 492.21, 250/221, 288, 292, 309, 398, 423 P, 455.11
See application file for complete search history.

(56) References Cited

U.S. PATENT DOCUMENTS 7,692,165 B2 * 4/2010 Winkler ................... 250/492.21

FOREIGN PATENT DOCUMENTS

| JP | 59-048738 U | 3/1984 |
| JP | 63-016537 A | 1/1988 |
| JP | 02-087454 A | 3/1990 |
| JP | 07-240165 A | 9/1995 |
| WO | WO 2010/132265 A2 | 11/2010 |

* cited by examiner

*Primary Examiner* — David A Vanore
(74) *Attorney, Agent, or Firm* — Miles & Stockbridge P.C.

(57) ABSTRACT

To avoid a glow discharge during the use of a conventional gas ionization chamber, there is no alternative but to increase a gas pressure. Therefore, while a conventional gas ionization chamber is used, an ion current cannot be increased by raising a gas introduction pressure. An object of the present invention is to increase the ion current by raising the gas pressure and prevent an ion beam from being scattered by an ionization gas. The gas is supplied from a structure maintained at a ground potential to prevent the application of a high voltage to the vicinity of an ionization gas introduction port at which the gas pressure is relatively high. Further, the ionization gas existing in a region through which the ion beam passes is preferentially reduced by performing differential evacuation from a lens opening in a lens electrode that forms an acceleration/focusing lens.

14 Claims, 10 Drawing Sheets

ION BEAM DEVICE HAVING GAS INTRODUCTION PORT DISPOSED ON STRUCTURE MAINTAINED AT GROUND POTENTIAL

TECHNICAL FIELD

The present invention relates to an ion microscope, ion beam machining/observation device, or other ion beam device and to a combination of such an ion beam device and an electron microscope.

BACKGROUND ART

When a sample is scanned by irradiating it with electrons to detect secondary charged particles emitted from the sample, the structure of the surface of the sample can be observed. A device used for such observation is called a scanning electron microscope (hereinafter abbreviated as the SEM). Meanwhile, the structure of the sample surface can also be observed by using an ion beam. A device used for such observation is called a scanning ion microscope (hereinafter abbreviated as the SIM). The ion beam is more sensitive to information about the sample surface than an electron beam. The electron beam is a wave of electrons and inevitably aberrated due to a diffraction effect. The ion beam, on the other hand, is insignificantly aberrated due to the diffraction effect because ions are heavier than electrons.

A gas field ion source is as suitable ion source for an ion microscope. The gas field ion source is capable of generating an ion beam having a narrow energy width. Further, as an ion generation source is small in size, it can generate a fine ion beam.

To use the ion microscope for observing a sample at a high signal-to-noise ratio, it is necessary to obtain an ion beam having a high current density. To obtain such an ion beam, it is necessary to increase an ion radiation angle current density of a field ion source. The ion radiation angle current density can be increased by increasing the molecular density of an ion material gas (ionization gas) in the vicinity of an emitter tip.

The molecular density of a gas per unit pressure is in inverse proportion to the temperature of the gas. Therefore, the molecular density of the ionization gas in the vicinity of the emitter tip can be increased by cooling the emitter tip to an ultra-low temperature for the purpose of lowering the temperature of the gas in the vicinity of the emitter tip.

The molecular density of the ionization gas in the vicinity of the emitter tip can also be increased by increasing the pressure of the ionization gas in the vicinity of the emitter tip. Under normal conditions, the pressure of the ionization gas in the vicinity of the emitter tip is approximately $10^{-2}$ to 10 Pa. If the pressure of the ionization gas is further increased to increase the pressure of the ion material gas to approximately 1 Pa or higher, the ion beam collides with a neutral gas and becomes neutralized, thereby decreasing an ion current.

Moreover, when the number of gas molecules in the field ion source is increased by raising the pressure of the ionization gas, the gas molecules whose temperature rises when they collide with a wall of a high-temperature vacuum vessel collide with the emitter tip at an increased frequency. Thus, the temperature of the emitter tip rises to decrease the ion current. To avoid such a decrease in the ion current, the field ion source has a gas ionization chamber that mechanically surrounds the emitter tip.

In an example disclosed in Patent Literature 1, the gas ionization chamber surrounds the emitter tip by using an ion extraction electrode while the ion extraction electrode is provided with an ionization gas introduction port.

CITATION LIST

Patent Literature

Patent Literature 1: Japanese Unexamined Patent Application Publication No. Hei7 (1995)-240165

SUMMARY OF INVENTION

Technical Problem

However, a conventional gas ionization chamber described, for instance, in Patent Literature 1 is configured by using an ion extraction electrode while the ion extraction electrode, which is floating at a high voltage, is provided with an ionization gas introduction port. Therefore, there is a danger that a glow discharge may occur in the vicinity of the ionization gas introduction port, which is subjected to high gas pressure. As such being the case, there was no alternative but to lower the gas pressure in order to avoid a glow discharge. In other words, the ion current could not be increased by raising a gas introduction pressure.

Solution to Problem

The present invention has been made to solve the above problem. A gas field ion source for an ion beam device provided by the present invention is configured so that an ionization gas is supplied from a gas introduction port disposed in a structure maintained at a ground potential.

Advantageous Effects of Invention

As the above-described configuration ensures that the vicinity of the introduction port for the ionization gas having a relatively high gas pressure is maintained at the ground potential, it is possible to reduce the glow discharge in the vicinity of an ionization gas introduction port. Hence, the gas introduction pressure can be increased to increase the pressure of the ionization gas for the purpose of increasing the ion current. This makes it possible to observe a sample at a high signal-to-noise ratio.

DESCRIPTION OF EMBODIMENTS

Figure 1:
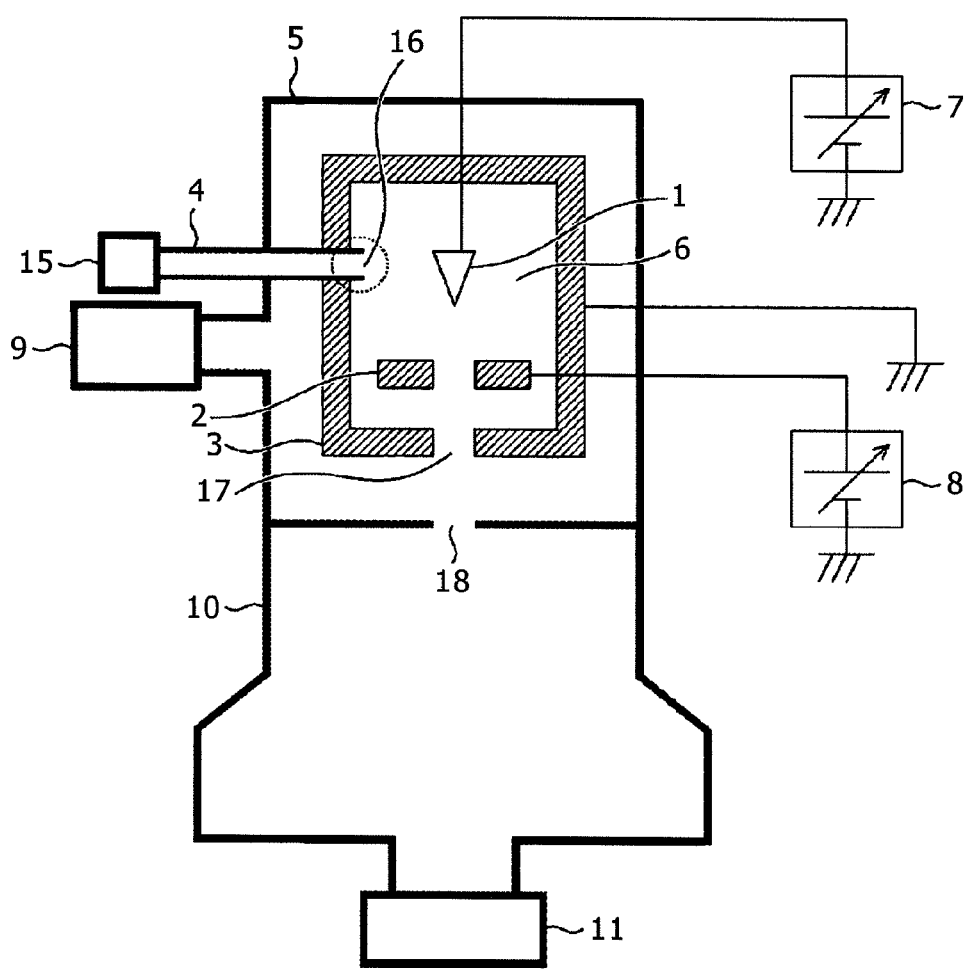
FIG. 1 is a schematic diagram illustrating the configuration of an ion beam device according to a first embodiment of the present invention.

An ion beam device according to a first embodiment of the present invention will now be described with reference to FIG. 1. The ion beam device includes an ion source chamber 5, which has an emitter tip 1, an extraction electrode 2, an acceleration/focusing lens electrode 3, and a gas supply piping 4; an ion source evacuation pump 9, which evacuates the ion source chamber 5; an ionization gas source 15; an acceleration power supply 7 for supplying a voltage to the emitter tip 1; an extraction power supply 8 for supplying a voltage to the extraction electrode 2; a sample chamber 10; and a sample chamber evacuation pump 11 for evacuating the sample chamber 10. The ion source chamber 5 is linked to the sample chamber 10 through an opening 18. The gas supply piping 4 is connected to the gas source 15 and used to supply a gas to the interior of a gas ionization chamber 6 through a gas introduction port 16. The gas supply piping 4 and the gas introduction port 16 are collectively referred to as a gas introduction section.

The gas introduction section supplies the gas to a space between the apex portion of the emitter tip 1 and the extraction electrode 2. The gas ionized in the space is used by the extraction electrode 2 to form an ion beam. In this instance, the emitter tip 1 becomes an anode and the extraction electrode 2 becomes a cathode. Further, a cooling mechanism (not shown) is incorporated to cool the emitter tip 1 and its vicinity.

The acceleration power supply 7 applies a voltage to the emitter tip 1, and the extraction power supply 8 applies a voltage to the extraction electrode 2. The acceleration/focusing lens electrode 3 is maintained at a ground potential no matter whether the ion beam device operates. The acceleration/focusing lens electrode 3 surrounds the emitter tip 1. The space surrounded by the acceleration/focusing lens electrode 3 is used as the gas ionization chamber 6, which ionizes the gas. The gas supply piping 4 is disposed so that the ionization gas introduction port is provided for the acceleration/focusing lens electrode 3 maintained at a ground potential.

In the gas ionization chamber 6, the gas pressure of the gas introduced into the gas ionization chamber 6 is highest in the vicinity of the ionization gas introduction port. It is known that an ion current increases with an increase in the gas pressure. In the past, however, the ionization gas introduction port was provided for the extraction electrode 2 to which a voltage is applied, that is, for a portion floating at a high voltage, or provided in the vicinity of the extraction electrode 2. Therefore, when the gas pressure in the gas ionization chamber 6 was increased, a glow discharge occurred in the vicinity of the ionization gas introduction port. This made it difficult to increase the ion current by raising the gas pressure of the ionization gas. The glow discharge may also occur in the vicinity of the ionization gas introduction port, which is placed under high gas pressure, due to a charged or contaminated insulating cylinder or insulation performance deterioration caused by aging. In the present embodiment, however, the ionization gas introduction port is maintained at a ground potential. Therefore, even when the gas pressure to be applied to the gas ionization chamber 6 is increased, the present embodiment makes it possible to inhibit the occurrence of the glow discharge at the ionization gas introduction port. Consequently, the ion beam device according to the present embodiment is capable of increasing the ion current by raising the gas pressure of the ionization gas.

Further, a conventional gas field ion source was configured so that the ionization chamber was exposed to a room temperature through the wall of an ion source chamber or of a sample chamber. Thus, gas molecules heated to a high temperature when they collided with a high-temperature wall of a vacuum vessel collided with the, emitter tip to raise its temperature, thereby decreasing the ion current. Meanwhile, the acceleration/focusing lens electrode 3 according to the present embodiment also serves as a radiation shield that reduces a thermal-radiation-induced heat inflow to the emitter tip 1, which is cooled. As the acceleration/focusing lens electrode 3 is disposed to surround the emitter tip 1, it is possible to effectively reduce the thermal-radiation-induced heat inflow to the emitter tip 1 from a room-temperature wall of the ion source chamber 5. Moreover, as the acceleration/focusing lens electrode 3 is used as the gas ionization chamber 6 and as the radiation shield, it contributes to downsizing of the device.

When it comes to a space in which the ion beam in the ion source chamber 5 propagates, the gas introduced into the gas ionization chamber 6 is ionized by the emitter tip 1, extracted by the extraction electrode 2, accelerated and focused by the acceleration/focusing lens electrode 3, passed through the opening 18 as an ion beam, and directed toward the sample chamber 10.

When the gas pressure in the gas ionization chamber is increased, the gas accumulated in the gas ionization chamber is likely to scatter the ion beam, thereby reducing an ion beam current. How to reduce such beam scattering was a problem for a conventional ion beam device. It is preferred that the gas pressure in the vicinity of the emitter tip 1 be maintained high for efficient gas ionization. Meanwhile, it is preferred that the gas pressure in the space in which the ion beam formed of the ionized gas propagates be maintained low in order to prevent the ion beam from colliding with the gas and scattering.

In the present embodiment, an acceleration/focusing lens electrode opening 17 is disposed on the optical axis of the ion beam. As the pressure in the ion source chamber 5 is lower than the pressure in the gas ionization chamber 6 and the gas ionization chamber 6 is hermetically closed except the acceleration/focusing lens electrode opening 17, the gas introduced into the gas ionization chamber 6 is differentially evacuated from the acceleration/focusing lens electrode opening 17. This ensures that the gas pressure around the emitter tip 1 is high, and that the gas pressure in the vicinity of the acceleration/focusing lens electrode opening 17, which allows the ion beam to pass through, is low. Consequently, the scattering of the ion beam, which is caused by the ionization gas, can be reduced.

In the present embodiment, only one acceleration/focusing lens electrode 3 is used as an acceleration/focusing lens. Alternatively, however, a plurality of acceleration/focusing lens electrodes may be used. When two or more acceleration/focusing lens electrodes are used, it is possible to adjust, for example, the position of a virtual image point by applying a voltage to an acceleration/focusing lens electrode that does not form the gas ionization chamber 6. This alternative is also applicable to later-described embodiments.

Figure 2:
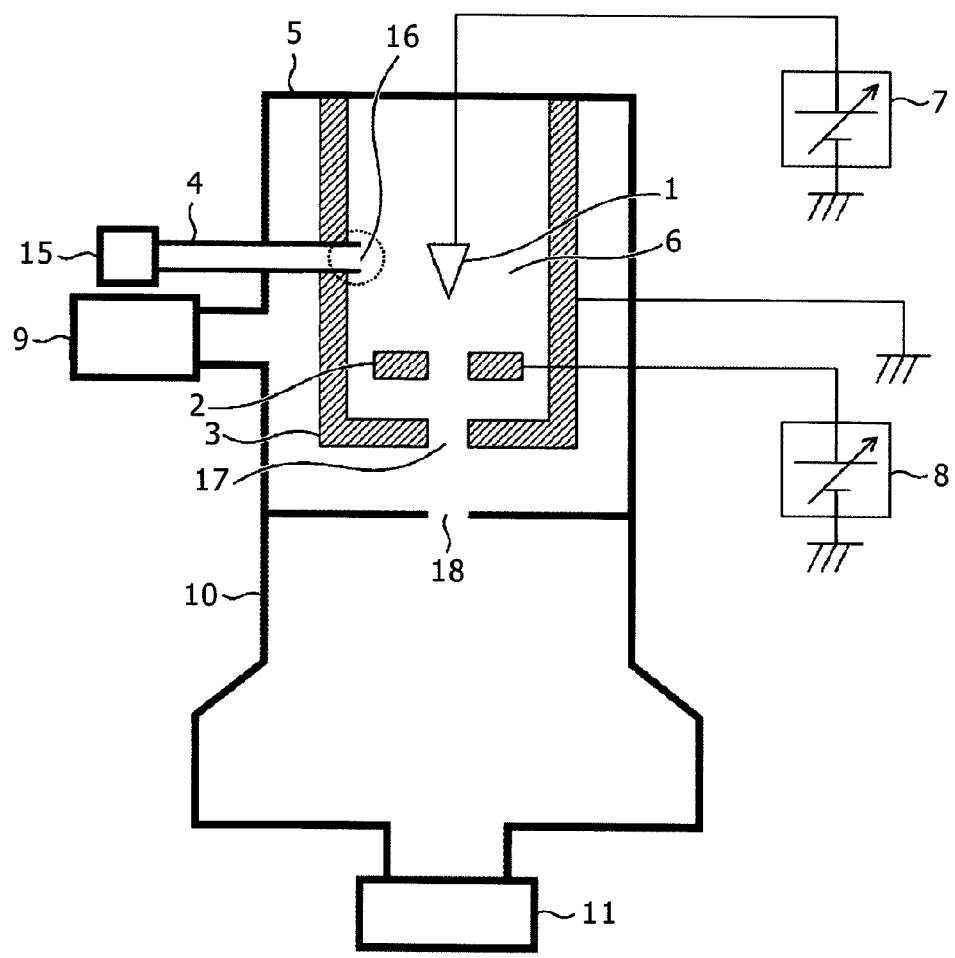
FIG. 2 is a schematic diagram illustrating the configuration of the ion beam device according to a second embodiment of the present invention.

FIG. 2 is a diagram illustrating the ion beam device according to a second embodiment of the present invention. In the second embodiment, the upper end of the acceleration/focusing lens electrode 3, which serves as the radiation shield, is connected to the ion source chamber 5. The gas ionization chamber 6 is formed by the acceleration/focusing lens electrode 3 maintained at a ground potential and by a part of a vacuum wall of the ion source chamber 5. When the emitter tip 1 is to be cooled to the vicinity of liquid helium temperature, it is necessary to avoid the thermal-radiation-induced heat inflow to the emitter tip 1 by thermally floating the radiation shield and surrounding the emitter tip 1 with the radiation shield as described in conjunction with the first embodiment. However, if the cooling temperature for the emitter tip 1 is high, a simple radiation shield according to the second embodiment may be used. The present embodiment is advantageous in that it permits the use of a simple, small-size structure.

Figure 3:
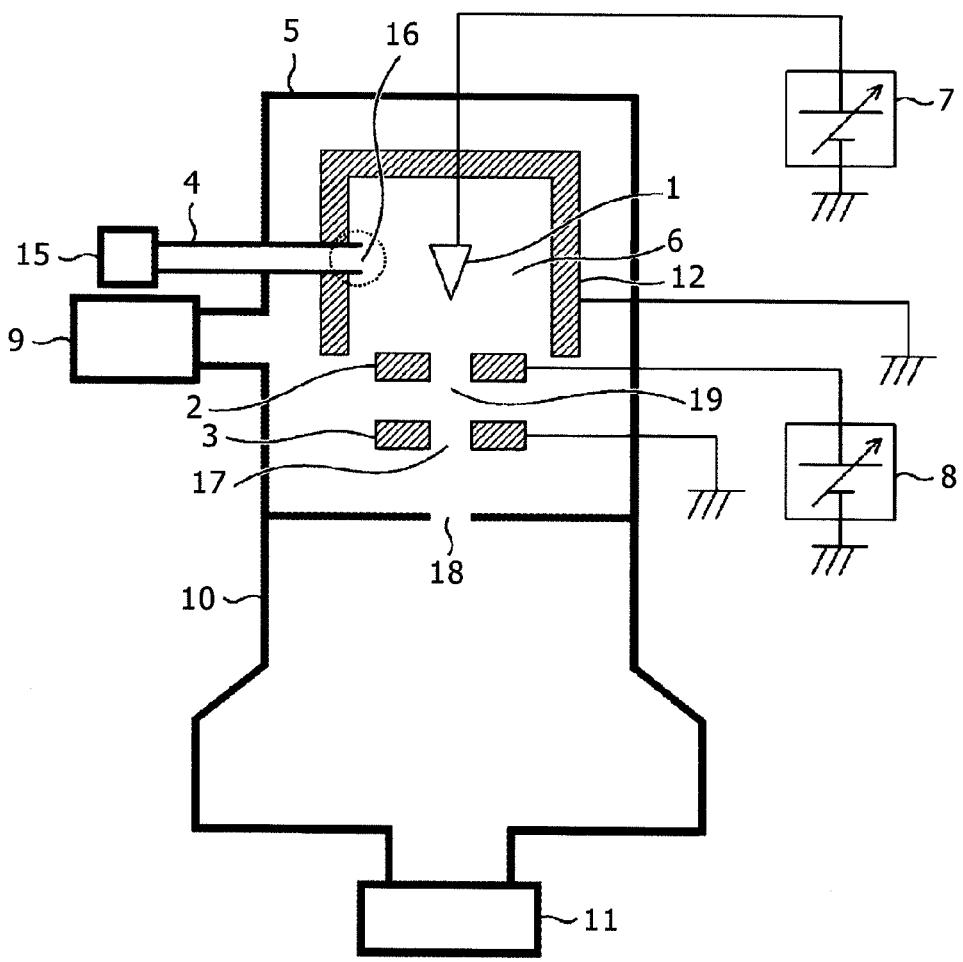
FIG. 3 is a schematic diagram illustrating the configuration of the ion beam device according to a third embodiment of the present invention.

FIG. 3 is a diagram illustrating the ion beam device according to a third embodiment of the present invention. In the first and second embodiments, the acceleration/focusing lens electrode 3 is used to form the gas ionization chamber 6 and the radiation shield. In the third embodiment, on the other hand, the acceleration/focusing lens electrode 3 and a radiation shield 12 are separately provided. In other words, the gas ionization chamber 6 is formed by the radiation shield 12 and the extraction electrode 2. The ionization gas introduction port needs to be maintained at a ground potential because it is secured to the radiation shield 12, which is maintained at a ground potential. This prevents the occurrence of the glow discharge in the vicinity of the ionization gas introduction port when the gas pressure is increased. Meanwhile, a voltage is applied to the extraction electrode 2 so that it acts as a cathode in relation to the emitter tip 1. Hence, the radiation shield 12 and the extraction electrode 2 need to be positioned at a distance from each other.

The extraction electrode 2 cannot only extract ions, but also reduce the thermal radiation from the room-temperature wall of the ion source chamber 5 to the emitter tip 1 when the extraction electrode 2 is additionally thermally insulated and cooled.

When voltages to be applied to the emitter tip 1 and the extraction electrode 2 are relatively low with a simple insulation structure employed, the present embodiment makes it possible to reduce the size of the gas ionization chamber 6, which is used to accumulate the gas. As the present embodiment can also downsize the ion beam device, it is effective in increasing the efficiency of evacuation and conserving energy.

In the first and second embodiments, an opening in the gas ionization chamber 6 doubles as the opening in the acceleration/focusing lens electrode 3. Therefore, the first and second embodiments perform differential evacuation from the opening in the acceleration/focusing lens electrode 3. Meanwhile, in the present embodiment in which the extraction electrode 2 forms a part of the gas ionization chamber 6, the gas introduced into the gas ionization chamber 6 is differentially evacuated through an extraction electrode opening 19, which is an opening in the extraction electrode 2. This ensures that the gas pressure around the emitter tip 1 is high, and that the gas pressure in the extraction electrode opening, which allows the ion beam to pass through, is low. Consequently, the scattering of the ion beam, which is caused by the ionization gas, can be reduced while a high gas pressure is maintained in the gas ionization chamber 6.

Figure 4:
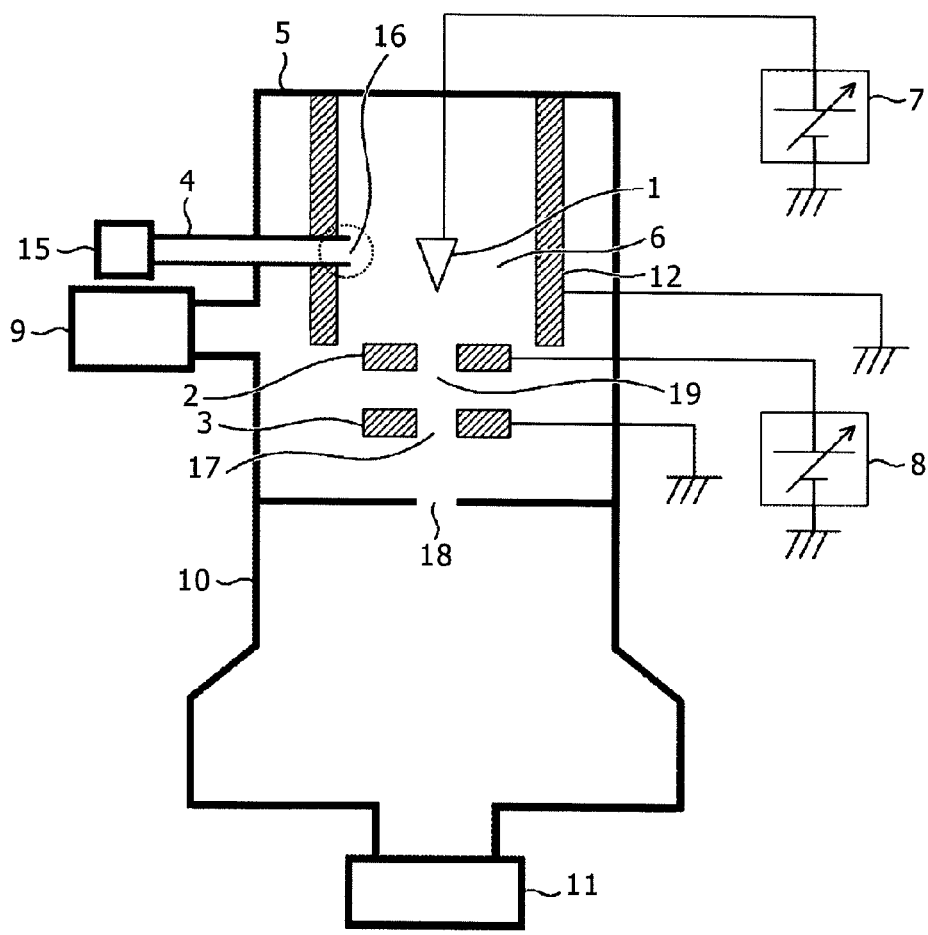
FIG. 4 is a schematic diagram illustrating the configuration of the ion beam device according to a fourth embodiment of the present invention.

FIG. 4 is a diagram illustrating the ion beam device according to a fourth embodiment of the present invention. The fourth embodiment is a modification of the third embodiment. The fourth embodiment is different from the third embodiment in that the upper end of the radiation shield 12 is connected to the ion source chamber 5. The gas ionization chamber 6 according to the fourth embodiment includes a part of the ion source chamber 5 in addition to the radiation shield 12 and the extraction electrode 2. When the cooling temperature for the emitter tip 1 is high, a simple radiation shield according to the present embodiment may be used. As such a simple radiation shield is adopted, the present embodiment is advantageous in that it permits the use of a simple, small-size structure.

Figure 5:
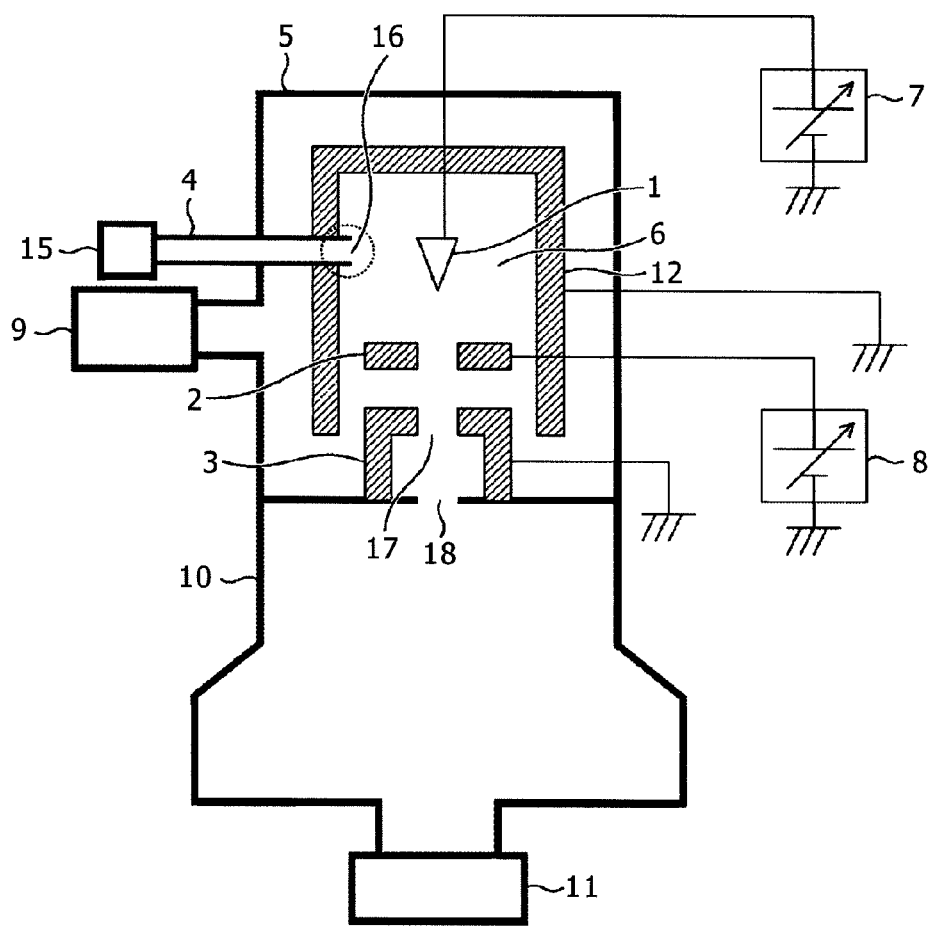
FIG. 5 is a schematic diagram illustrating the configuration of the ion beam device according to a fifth embodiment of the present invention.

FIG. 5 is a diagram illustrating the ion beam device according to a fifth embodiment of the present invention. In the fifth embodiment, the acceleration/focusing lens electrode 3 and the radiation shield 12 are not integral with each other, but are formed as separate elements. The gas ionization chamber 6 according to the present embodiment includes the acceleration/focusing lens electrode 3 and the radiation shield 12. If the shape of the acceleration/focusing lens electrode 3 needs to be complicated, the configuration according to the present embodiment should be used to increase the degree of design freedom. As the acceleration/focusing lens electrode 3 and the radiation shield 12 are maintained at a ground potential, the vicinity of the gas introduction port 16 provided for the radiation shield 12 is maintained at a ground potential.

The acceleration/focusing lens electrode 3 is boxed by a lens electrode and by the bottom surface of the ion source chamber. The acceleration/focusing lens electrode opening 17 and an opening 18 spatially linked to it are the openings in the gas ionization chamber 6. The gas introduced into the gas ionization chamber 6 is not differentially evacuated by an ion source evacuation pump of the ion source chamber 5, but is differentially evacuated mainly by the sample chamber evacuation pump from the acceleration/focusing lens electrode opening 17 and the opening 18 through the sample chamber 10. The introduced gas is a rare gas. When the ion source evacuation pump 9 is a non-evaporable getter pump, which cannot evacuate a rare gas, an impurity gas other than the rare gas can be preferentially discharged to increase the purity of the introduced rare gas. Further, when a turbomolecular pump is used as the sample chamber evacuation pump, the gas ionization chamber filled with the rare gas can be differentially evacuated.

Figure 6:
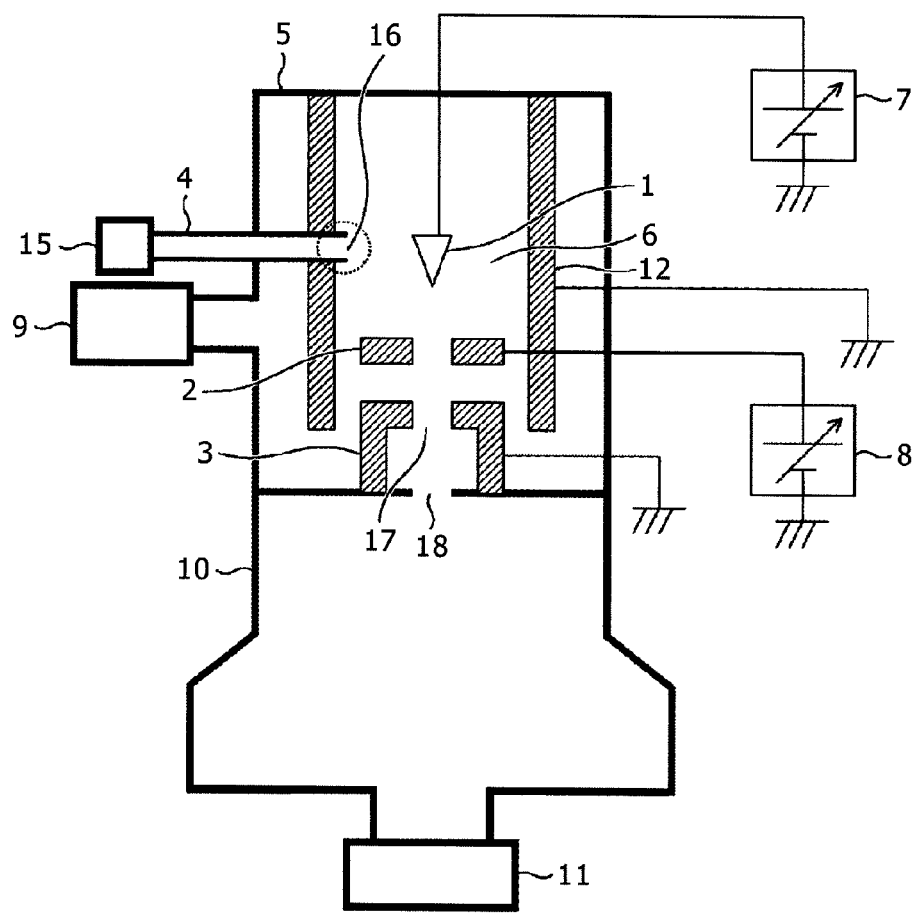
FIG. 6 is a schematic diagram illustrating the configuration of the ion beam device according to a sixth embodiment of the present invention.

FIG. 6 is a diagram illustrating the ion beam device according to a sixth embodiment of the present invention. The sixth embodiment is a modification of the fifth embodiment. In the sixth embodiment, the upper end of the radiation shield 12 is connected to the ion source chamber 5. In other words, the gas ionization chamber 6 according to the present embodiment includes a part of the ion source chamber 5 in addition to the radiation shield 12 and a part of the acceleration/focusing lens electrode 3. When the cooling temperature for the emitter tip 1 is high, a simple radiation shield according to the present embodiment maybe used. As such a simple radiation shield is adopted, the present embodiment is advantageous in that it permits the use of a simple, small-size structure.

Figure 7:
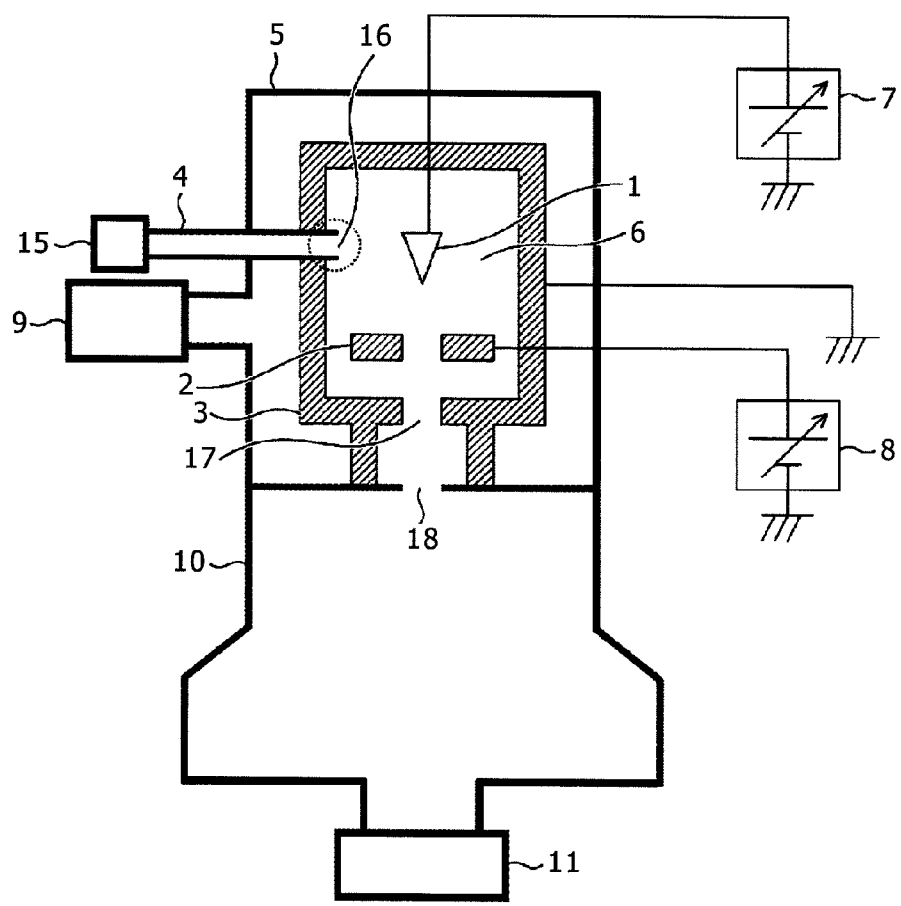
FIG. 7 is a schematic diagram illustrating the configuration of the ion beam device according to a seventh embodiment of the present invention.

FIG. 7 is a diagram illustrating the ion beam device according to a seventh embodiment of the present invention. The seventh embodiment is a modification of the first embodiment. The seventh embodiment is configured so that the acceleration/focusing lens. electrode 3 forms the gas ionization chamber 6 and the radiation shield 12 as described in conjunction with the first embodiment. In the structure according to the fifth embodiment, the radiation shield 12 and the acceleration/focusing lens electrode 3 are disposed separately and apart from each other. Therefore, the gas ionization chamber 6 according to the fifth embodiment is linked to the outside not only through the acceleration/focusing lens electrode opening 17 but also through a gap between the radiation shield 12 and the acceleration/focusing lens electrode 3. Meanwhile, the seventh embodiment is configured so that the acceleration/focusing lens electrode 3 is integral with the radiation shield 12. Therefore, the gas in the gas ionization chamber 6 is discharged to the outside only through the acceleration/focusing lens electrode opening 17. Consequently, the seventh embodiment increases the sealability of the gas ionization chamber 6.

Figure 8:
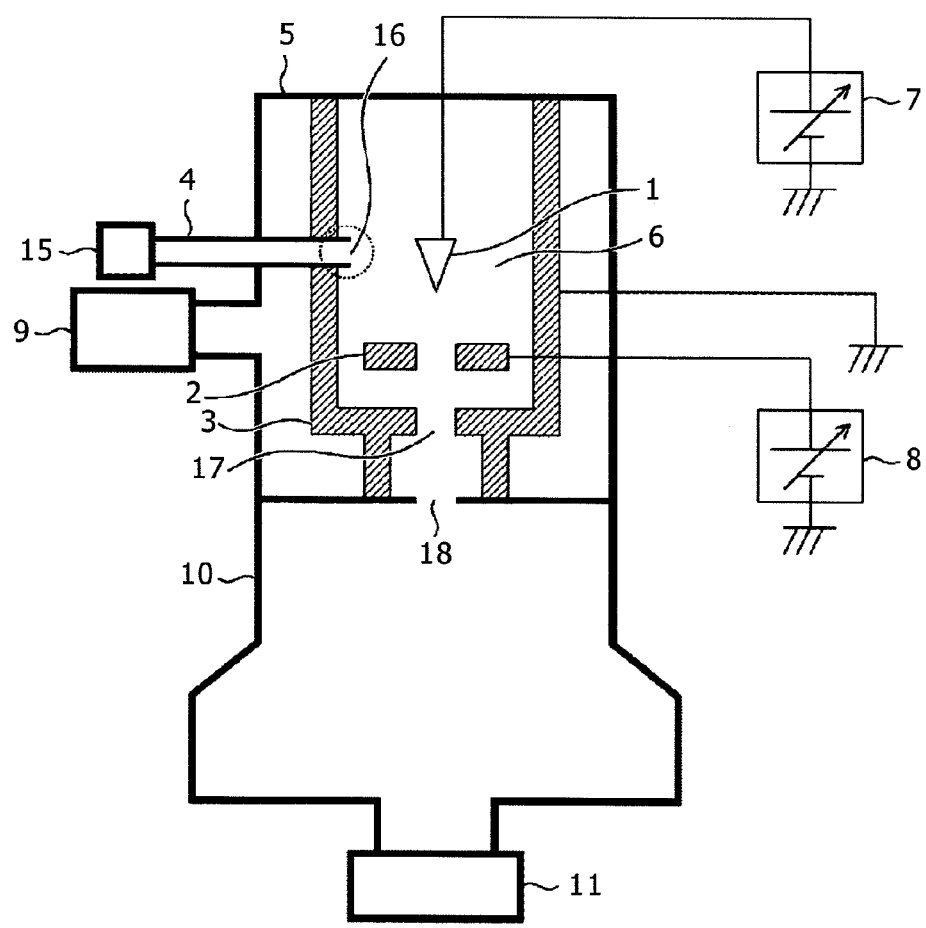
FIG. 8 is a schematic diagram illustrating the configuration of the ion beam device according to an eighth embodiment of the present invention.

FIG. 8 is a diagram illustrating the ion beam device according to an eighth embodiment of the present invention. The eighth embodiment is a modification of the seventh embodiment. The eighth embodiment is configured so that the upper end of the acceleration/focusing lens electrode 3 is connected to the ion source chamber 5. The gas ionization chamber 6 according to the present embodiment is formed by the acceleration/focusing lens electrode 3 and a part of the ion source chamber 5. In the present embodiment, the acceleration/focusing lens electrode 3 serves as the radiation shield 12. When the cooling temperature for the emitter tip 1 is high, a simple radiation shield according to the present embodiment may be used. As such a simple radiation shield is adopted, the present embodiment not only provides the advantage of the seventh embodiment, but also provides an additional advantage in that it permits the use of a simple, small-size structure.

Figure 9:
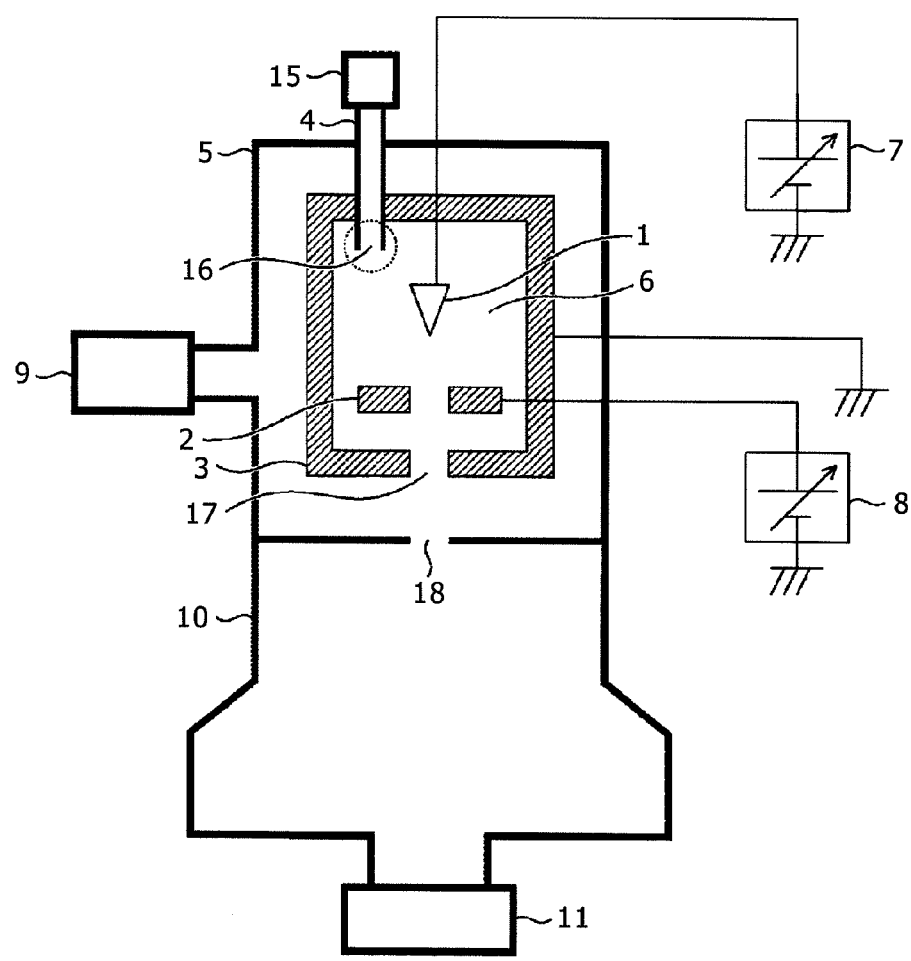
FIG. 9 is a schematic diagram illustrating the configuration of the ion beam device according to a ninth embodiment of the present invention.

FIG. 9 is a diagram illustrating the ion beam device according to a ninth embodiment of the present invention. Although the gas supply piping 4 and the ion gas introduction port are disposed on a lateral surface, they may be disposed on an upper surface. It is obvious that this feature of the ninth embodiment is also applicable to the first to eighth embodiments.

Figure 10:
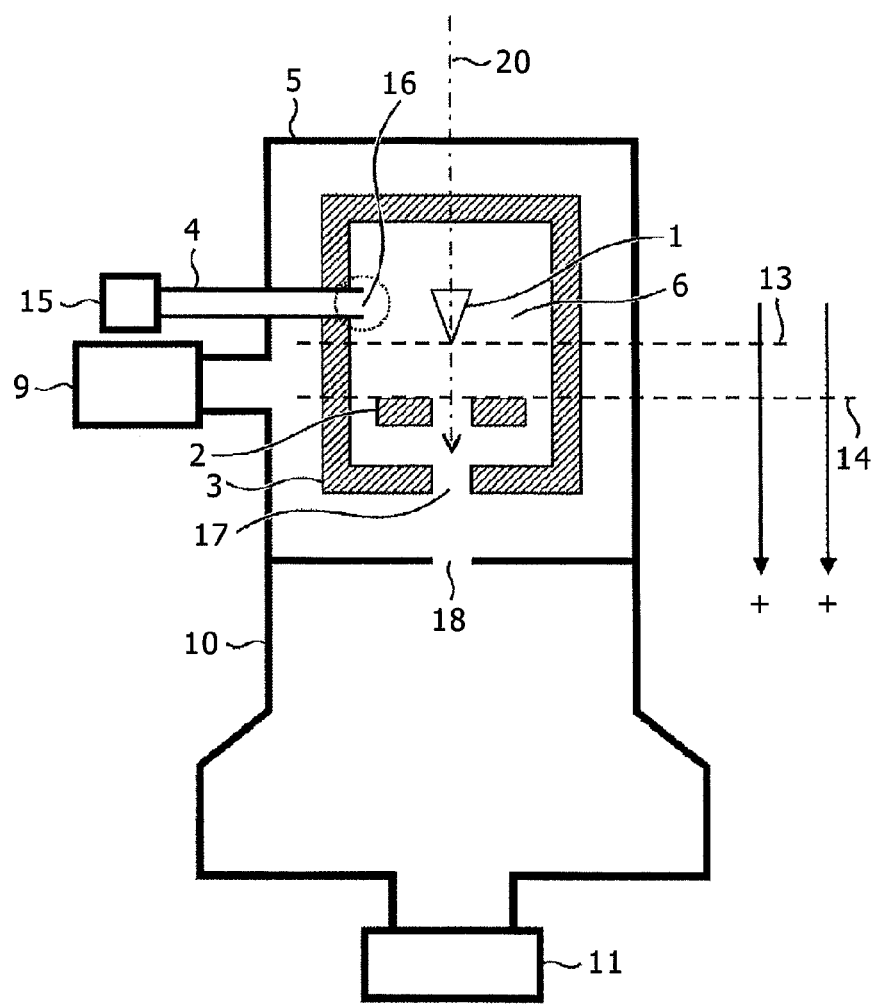
FIG. 10 is a diagram illustrating a position at which an ionization gas introduction port is disposed.

FIG. 10 shows a position at which the ionization gas introduction port is disposed. As mentioned earlier, the gas pressure in the gas ionization chamber 6 is highest in the vicinity of the ionization gas introduction port. As explained earlier, although the gas pressure in the vicinity of the emitter tip 1 should be increased for efficient gas ionization, the gas pressure in the space in which the ionized gas propagates in the form of an ion beam should be lowered to prevent the ion beam from being scattered by the ionization gas.

As such being the case, when an optical axis along which the ions pass is a Z-axis 20 and the ionized gas is extracted from the emitter tip 1 by the extraction electrode 2 and advanced in a position direction of the Z-axis 20, the ionization gas introduction port is disposed in a space on a minus Z side while a plane perpendicular to the Z-axis 20, which exists at an extraction electrode upper surface position 14, namely, the emitter tip side surface of the extraction electrode, is regarded as a boundary (a position at which $Z=0$). In other words, the gas introduction port 16 is disposed in a space on the side toward the emitter tip 1 and away from a plane containing the emitter tip side surface of the extraction electrode 2. This ensures that the gas introduction port 16 at which the gas pressure is highest within the gas ionization chamber 6 is positioned apart from the space in which the ion beam propagates. Consequently, the scattering of the ion beam can be suppressed while raising the gas pressure in the gas ionization chamber 6.

When the flow of the gas is to be certainly directed from the emitter tip 1 through the extraction electrode 2 to the acceleration/focusing lens electrode opening 17, which provides differential evacuation, or from the emitter tip 1 to the opening in the extraction electrode 2, which provides differential evacuation, the ionization gas introduction port may be disposed in the space on the minus Z side while the aforementioned boundary plane (the position at which $Z=0$) is regarded as a plane that contains an emitter tip apex position 13 and is perpendicular to the optical axis. In other words, the gas introduction port 16 may be disposed in a space on the side toward the emitter tip 1 and away from a plane that contains the apex of the emitter tip and is perpendicular to the optical axis of the ion beam.

The position at which the gas introduction port is disposed, which has been described with reference to FIG. 10, is also applicable to the first to ninth embodiments.

The present invention is applicable to an ion beam device that uses a gas field ion source. The above-described ion beam device may be, for example, a scanning ion microscope, a device called a transmission ion microscope that irradiates a sample with an ion beam, detects ions transmitted through the sample, and acquires information indicative of the internal structure of the sample, or a focused ion beam device that irradiates a sample with heavy ions and machines the sample by means of sputtering. The present invention is also applicable to an FIB-SEM combine, which is a combination of a scanning electron microscope (SEM) and a focused ion beam (FIB) device.

LIST OF REFERENCE SIGNS

1 Emitter tip
2 Extraction electrode
3 Acceleration/focusing lens electrode
4 Gas supply piping
5 Ion source chamber
6 Gas ionization chamber
7 Acceleration power supply
8 Extraction power supply
9 Ion source evacuation pump
10 Sample chamber
11 Sample chamber evacuation pump
12 Radiation shield
13 Emitter tip apex position
14 Extraction electrode upper surface position
15 Gas source
16 Gas introduction port
17 Acceleration/focusing lens electrode opening
18 Opening
19 Extraction electrode opening
20 Z-axis

The invention claimed is:

1. An ion beam device that irradiates a sample with an ion beam generated from a gas field ion source,
    wherein the gas field ion source includes:
    an emitter tip that receives a supply of a voltage from an acceleration power supply and acts as an anode;
    an extraction electrode that receives a supply of a voltage from an extraction power supply and acts as a cathode;
    a gas introduction section that supplies a gas from a gas introduction port to a space between an apex of the emitter tip and the extraction electrode; and
    a vacuum vessel that houses the emitter tip and the extraction electrode and has an evacuation port for evacuating the gas,
    wherein the gas introduction port is disposed on a radiation shield portion of a structure which is inside the vacuum vessel and maintained at a ground potential.

2. The ion beam device according to claim 1,
    wherein the structure integrally includes a lens electrode that accelerates or focuses the ion beam.

3. The ion beam device according to claim 1,
wherein the structure is disposed to surround the emitter tip.

4. The ion beam device according to claim 1,
wherein the extraction electrode is disposed opposite the emitter tip, and
wherein the extraction electrode and the radiation shield portion of the structure are disposed to surround the emitter tip.

5. The ion beam according to claim 2,
wherein the structure is disposed to surround the emitter tip and provided with an opening through which the ion beam passes, and
wherein the gas is differentially evacuated through the opening.

6. The ion beam device according to claim 1,
wherein the gas introduction port of the gas introduction section is disposed on a side toward the emitter tip and away from a plane that contains the apex of the emitter tip and is perpendicular to an optical axis of the ion beam.

7. The ion beam device according to claim 1,
wherein the gas introduction port of the gas introduction section is disposed on a side toward the emitter tip and away from a plane that contains an emitter tip side surface of the extraction electrode.

8. An ion beam device that irradiates a sample with an ion beam generated from a gas field ion source,
wherein the gas field ion source includes:
an emitter tip that receives a supply of a voltage from an acceleration power supply and acts as an anode;
an extraction electrode that receives a supply of a voltage from an extraction power supply and acts as a cathode;
a gas introduction section that supplies a gas from a gas introduction port to a space between an apex of the emitter tip and the extraction electrode; and
a vacuum vessel that houses the emitter tip and the extraction electrode and has an evacuation port for evacuating the gas,
wherein a gas supply piping supplying the gas introduction port is received in an opening extending through a wall of a structure which is disposed inside the vacuum vessel and maintained at a ground potential.

9. The ion beam device according to claim 8,
wherein the structure includes a lens electrode that accelerates or focuses the ion beam 10. The ion beam device according to claim 8,
wherein the structure surrounds the emitter tip.

11. The ion beam device according to claim 8,
wherein the wall is disposed between a side of the vacuum vessel and the emitter tip.

12. The ion beam device according to claim 8,
wherein the wall is disposed between a top of the vacuum vessel and the emitter tip.

13. The ion beam device according to claim 8,
wherein the structure and a lens electrode that accelerates or focuses the ion beam are one body.

14. The ion beam device according to claim 1,
wherein the structure and a lens electrode that accelerates or focuses the ion beam are one body.

* * * * *